(12) United States Patent
Peschke

(10) Patent No.: US 11,009,527 B2
(45) Date of Patent: May 18, 2021

(54) DYNAMIC MEASURING SYSTEM AND METHOD FOR PROBING A DYNAMIC DATA SIGNAL

(71) Applicant: Rohde & Schwarz GmbH & Co. KG, Munich (DE)

(72) Inventor: Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 681 days.

(21) Appl. No.: 15/783,287

(22) Filed: Oct. 13, 2017

(65) Prior Publication Data
US 2018/0231585 A1    Aug. 16, 2018

(30) Foreign Application Priority Data
Feb. 10, 2017    (EP) ..................... 17155709

(51) Int. Cl.
*G01R 13/02*    (2006.01)
*G01R 19/25*    (2006.01)

(52) U.S. Cl.
CPC ..... *G01R 13/0254* (2013.01); *G01R 19/2506* (2013.01); *G01R 13/02* (2013.01)

(58) Field of Classification Search
CPC   G01R 13/0254; G01R 19/2506; G01R 13/02; G01R 13/00
See application file for complete search history.

(56) References Cited

U.S. PATENT DOCUMENTS

| | | | |
|---|---|---|---|
| 2010/0085362 A1* | 4/2010 | Tan ...................... | H04L 25/0216 345/440 |
| 2013/0244728 A1* | 9/2013 | Ryan ..................... | H04L 27/368 455/561 |

(Continued)

FOREIGN PATENT DOCUMENTS

| | | |
|---|---|---|
| EP | 0608664 A1 | 8/1994 |
| EP | 2491856 A1 | 8/2012 |
| EP | 2787355 A2 | 10/2014 |

OTHER PUBLICATIONS

Extended European Search Report dated Sep. 1, 2017, issued in priority European Application No. 17155709.3, filed Feb. 10, 2017, 8 pages.

*Primary Examiner* — Akm Zakaria
(74) *Attorney, Agent, or Firm* — Christensen O'Connor; Johnson Kindness PLLC

(57) ABSTRACT

A dynamic measuring system is described that comprises a measuring device. The measuring system has an acquisition unit and a post processing unit that is configured to post process the digital signal. The post processing unit has at least one signal correction filter being configured to be operated in at least two different modes for processing the digital signal. The signal correction filter has at least a first signal correction filter setting being used in a first mode and a second signal correction filter setting being used in a second mode. In addition, the measuring system has a switching unit that is configured to select the first mode or the second mode, the switching unit being configured to be operated dynamically based on an event in the data signal. The signal correction filter comprises time variable coefficients. Further, a method for probing a dynamic data signal is also described.

16 Claims, 1 Drawing Sheet

(56) References Cited

U.S. PATENT DOCUMENTS

2014/0300371 A1* 10/2014 Pickerd .................. F02P 17/00
                                                        324/537
2016/0252600 A1   9/2016 Kuhwald
2016/0344372 A1  11/2016 Kuhwald et al.

* cited by examiner

DYNAMIC MEASURING SYSTEM AND METHOD FOR PROBING A DYNAMIC DATA SIGNAL

FIELD OF THE DISCLOSURE

Embodiments of the present disclosure relates to a dynamic measuring system and a method for probing a dynamic data signal.

BACKGROUND

In the state of the art, measuring systems for probing digital signals are known which comprise different probes to be used for different operation modes of the device under test. Accordingly, the different probes are configured for a certain purpose. For instance, a fast probe is provided for a high speed mode of the measuring system. This fast probe may be established by a differential probe. In addition, a slow probe can be provided that is used in a low-power mode of the measuring system. The slow probe is established by a mass-referred probe, for instance.

In case the measuring system is used for probing a device under test that changes its characteristics dynamically during the probing, different measurements have to be carried out. For instance, at least two different measuring systems are used wherein these measuring systems are configured to be operated in different modes while using appropriate probes. The different measuring systems can be used simultaneously or sequentially.

Alternatively, the device under test is measured by a single measuring system several times in a sequential manner while using different corrections being adapted to the operation mode of the device under test. For instance, de-embedding with a certain source impedance in a high speed mode and de-embedding with another source impedance in a low-power mode. The different source impedances are set manually.

However, performing different measurements always requires additional efforts as the different measurements have to be compared and scaled appropriately. Furthermore, this might be a source of errors as the device under test has to be contacted at least twice.

EP 2 787 355 A2 shows a measurement system with a separation unit that is capable of identifying and separating different portions of the waveform associated to different characteristics such that the different portions can be processed by different filters having appropriate settings. Hence, each signal portion is processed by a respective filter having constant settings being appropriate.

EP 2 491 856 A1 shows a pulse detection watch for monitoring the pulse of a human wherein a filter unit is provided that comprises two different filters and a filter switching section that is configured to switch between both filters after a certain period of time.

SUMMARY

Therefore, there is a need for a measurement system and a method that ensure measuring a dynamic data signal in a more efficient way and that reduce the risk of error simultaneously.

Embodiments of the present disclosure provide a dynamic measuring system for probing a dynamic data signal comprising:

a measuring device with a probe interface that is configured to receive a probe signal from a probe wherein the probe signal corresponds to the dynamic data signal;

an acquisition unit that is configured to acquire and digitize the probe signal into a digital signal; and a post processing unit that is configured to post process the digital signal wherein the post processing unit has at least one signal correction filter being configured to be operated in at least two different modes for processing the digital signal, wherein the signal correction filter has at least a first signal correction filter setting being used in a first mode and a second signal correction filter setting being used in a second mode, wherein a switching unit is provided that is configured to select the first mode or the second mode, the switching unit being configured to be operated dynamically based on an event in the data signal, wherein the signal correction filter comprises time variable coefficients.

Further, embodiments of the present disclosure provide a method for probing a dynamic data signal with the following steps:

providing a probe for probing a dynamic data signal;

providing a measuring device having a probe interface for receiving a probe signal corresponding to the dynamic data signal;

processing the probe signal received by the probe in a post processing unit; and selecting a first mode or a second mode based on an event in the data signal such that a signal correction filter is set in a first signal filter setting or in a second signal filter setting for processing the probe signal, wherein the signal correction filter comprises time variable coefficients that are adapted over the time.

Accordingly, the measurement time and measurement efforts can be reduced significantly since at least one signal correction filter is used wherein its characteristics, for example, its time variable coefficients, are dynamically adapted over the time with regard to the dynamically changing characteristics of the device under test that is probed. This adaption is performed during the probing or during the post processing of the probe signal gathered. The dynamic data signal of the device under test is converted by the probe into a probe signal that is forwarded to the post processing unit comprising the signal correction filter.

Since the characteristics, for example the time variable coefficients, of the signal correction filter are adapted over the time appropriately with regard to the changing characteristics of the device under test, only a single contact is necessary for probing the device under test even though the device under test changes its characteristics dynamically over the time. Therefore, it is not necessary to compound the measuring results obtained by different measurements. As the characteristics of the signal correction filter are adapted in a dynamic manner, different filters do not have to be used, particularly to be switched on or off in order to adapt the measuring system to the dynamic changes of the characteristics of the device under test being probed. The dynamically changing characteristics of the device under test may relate to a changing operation mode of the device under test being probed. Accordingly, these changing characteristics of the device under test can be measured by the same measuring system without recontacting the device under test. Thus, the risk of error is reduced while probing the device under test.

In some embodiments, the post processing unit is switched in the respective mode while adapting the setting of the signal correction filter. The dynamic adaption of the signal correction filter ensures that the measurements can be done correctly even though the conditions of the measurement change over time. Hence, the signal correction filter used is tunable. The signal correction filter can be established by a digital filter, for example a digital signal processing filter (DSP filter), that is used to remove unwanted effects that are caused by a mismatch due to the discrete input impedance of the probe. The post processing unit may be configured to process the digital signal corresponding to the received probe signal in a digital manner. Thus, the post processing unit can be implemented, for example, in an application-specific integrated circuit (ASIC) or in a field programmable gate array (FPGA). Generally, the post processing unit may be configured to carry out the impedance matching of the device under test. Accordingly, it is not necessary that the impedance matching is done in the probe itself. The costs of the measuring system can be reduced appropriately. Generally, a time-variant correction is ensured by the dynamic measuring system.

In some embodiments, the filter is a single filter having one input and one output. In some embodiments, the dynamic data signal probed may be a signal of a device under test. For instance, the dynamic data signal is an electric signal.

Moreover, the measuring system, and in some embodiments the post processing unit, may comprise two different signal correction filters each provided for a dedicated mode. Thus, a first signal correction filter is provided in the first mode whereas the second signal correction filter is provided in the second mode of the post processing unit. Both signal correction filters comprise time variable coefficients that are dynamically adapted to the dynamic data signal, in particular its changing characteristics over the time. Accordingly, the first signal correction filter corresponds to the first signal correction filter setting whereas the second signal correction filter corresponds to the second signal correction filter setting.

The measuring device may comprise the acquisition unit, the post processing unit and the switching unit such that the measuring device is connected to the probe that directly contacts the device under test for gathering the dynamic data signals.

According to an aspect, the signal correction filter is configured to adapt its characteristics over time. The characteristics can be adapted live while using the measuring system for probing a device under test, in particular a dynamic data signal. The signal correction filter is controlled appropriately such that its characteristics are set based on the characteristics of the data signal probed.

According to another aspect, a detection unit is provided that is configured to detect the event in the probe signal. The detection unit detects a certain event in the probe signal that may correspond to another operation mode of the device under test. Thus, the detection unit is configured to detect a dynamic change in the probe signal corresponding to a dynamic change in the data signal. Based on the detection of the event, the detection unit may control the switching unit such that the switching unit selects the appropriate mode which in turn changes the setting of the signal correction filter accordingly. Further, the characteristics of the signal correction filter are adapted based on the detected event, in particular its time variable coefficients. The detection unit may be integrated in the measuring device.

Furthermore, a trigger unit may be provided that is configured to derive at least one event from the data signal in order to control the post processing unit. The trigger unit is separately formed with respect to a record trigger unit that is configured to trigger the beginning of the probing. The trigger unit controls the post processing unit, in particular via the switching unit, with regard to a dynamically changing probe signal, in particular changing characteristics of the probe signal that may relate to a different operation mode of the device under test. For instance, the detection unit has a trigger function such that the detection unit comprises the trigger unit. In other words, the detection unit and the trigger unit may be implemented in each other. The post processing unit, in particular the at least one signal correction filter, is set in the corresponding mode by the trigger unit while triggering on the event detected in the data signal. Thus, the setting of the signal correction filter is adapted based on the triggering event. For instance, the trigger unit controls the switching unit such that the setting of the signal correction filter is changed from the first signal correction filter setting to the second one. Further, the time variable coefficients may be adapted appropriately based on the triggering event.

The trigger unit may be configured to automatically adapt the signal correction filter, in particular the time variable coefficients of the signal correction filter. Accordingly, no manual input is required to adapt the setting and characteristics of the signal correction filter. Therefore, the correction parameters of the at least one signal correction filter are triggered due to the event detected in the data signal. The trigger unit may be a mode trigger.

Another aspect provides that the dynamic measurement system comprises a probe, wherein the detection unit is integrated in the probe. This probe is suitable for high voltage and low voltage signals as the post processing unit is adapted appropriately. In some embodiments, a single probe is sufficient for the dynamic probe signal. The probe may comprise the detection unit such that the event is already detected by the probe. The event is detected in the dynamic data signal probed. Further, the occurrence of such an event may be indicated via the probe, for instance by a light emitting diode.

Further, the measuring device may be an oscilloscope, wherein the detection unit is integrated in the oscilloscope. The oscilloscope is connected with the probe such that the device under test is contacted by the probe for generating the probe signal that is forwarded to the oscilloscope for analyzing purposes. The detection unit detects the event in the probe signal or the digital signal wherein the probe signal and the digital signal correspond to the dynamic data signal. Thus, the occurrence of an event in the probe signal or in the digital signal implies that an event occurs in the dynamic data signal.

For instance, the first mode is a high voltage mode and/or the second mode is a low voltage mode. Thus, the single measurement system is suitable for processing high voltage and low voltage probe signals as the setting and characteristics, in particular the time variable coefficients, of the at least one signal correction filter are adapted accordingly.

Moreover, the first mode can be a single ended mode and/or the second mode may be a differential mode. The probe may have two different contacts for probing a first signal and a second signal, for instance a positive line and a negative line. One of these signals may be constant relating to a constant voltage such as a ground. Alternatively, both signals are complementary to each other.

According to another aspect, the dynamic measuring system is configured to use a single probe such that a single measurement channel of the measurement device is occupied during probing the dynamic data signal. As only one measurement channel is occupied, the measuring device, in particular the oscilloscope, can be established in a simpler manner. Further, other measurement channels of the measurement device can be used for other measurements. Thus, the costs can be reduced for doing different measurements simultaneously.

An aspect provides that the event is detected by a detection unit. The detection unit screens the probe signal or the dynamic data signal for dynamic changes representing an event.

According to another aspect, the time variable coefficients are adapted automatically by using a trigger unit that derives at least one event from the data signal and, further, controls the post processing unit. The trigger unit searches for certain events and controls the post processing unit appropriately such that the setting and characteristics of the at least one signal correction filter are adjusted. The characteristics relate to time variable coefficients ensuring that the at least one signal correction filter can be adapted over the time. The time variable coefficients of the signal correction filter are set in an automatic manner such that the dynamic changes are taken into account without any manual input.

The probe may contact a device under test providing the dynamic data signal only once. Therefore, it is not necessary to perform different measurement in a sequential manner wherein the device under test has to be contacted several times, in particular with different probes.

In some embodiments, a dynamic measuring system as mentioned above is provided for performing the probing.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
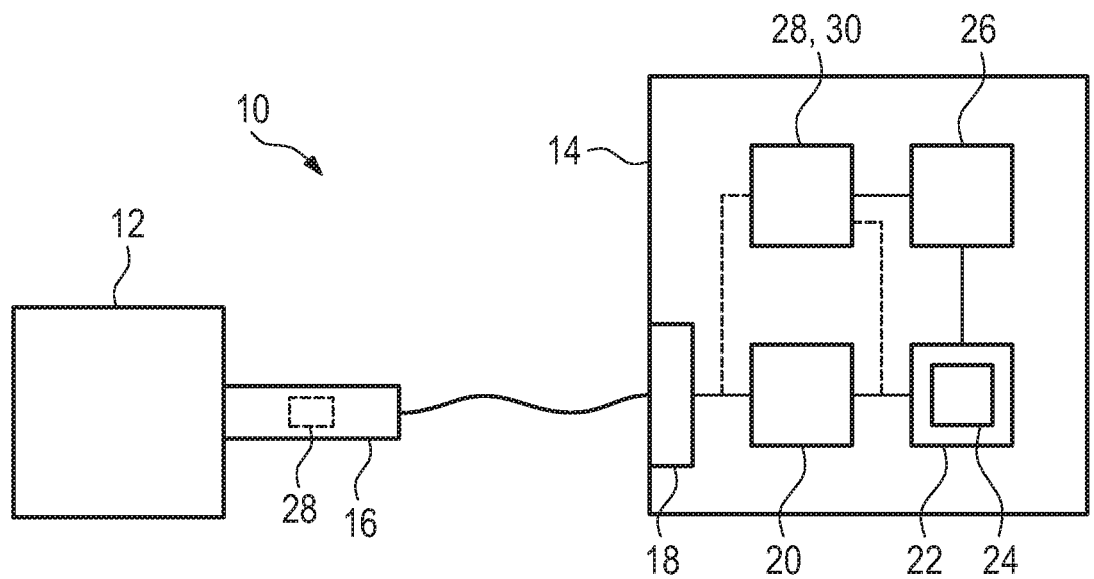
FIG. 1 schematically shows a dynamic measuring system according to an embodiment of the disclosure.

FIG. 1 depicts a representative embodiment of a dynamic measuring system 10 suitable for use for probing a dynamic data signal from a device under test 12. As shown in FIG. 1, the dynamic measuring system 10 comprises a measuring device 14 and a probe 16 that is connected with the measuring device 14 via a probe interface 18 formed at the measuring device 14. The measuring device 14 may be established by an oscilloscope.

The probe 16 directly contacts the device under test 12 for gathering the data signal transmitted by the device under test 12. The data signal is converted into a probe signal, which is then forwarded to the measuring device 14 for further processing (e.g., for analyzing purposes inter alia).

The measuring device 14 comprises an acquisition unit 20 that is directly connected to the probe interface 18 for receiving the probe signal. The acquisition unit 20 acquires and digitizes the probe signal into a digital signal that can be processed further in an easy manner.

The acquisition unit 20 is also connected to a post processing unit 22 that is configured to post process the digital signal. In some embodiments, the post processing unit 22 is configured for digitally processing the digitized probe signal. The post processing unit 22 comprises at least one signal correction filter 24 that comprises time variable coefficients that can be adapted appropriately as will be described later. In general, the signal correction filter 24 may be a digital filter, for instance a digital signal processing filter (DSP filter), such that the digitized signal is corrected by the post processing unit 22 appropriately.

In addition, the measuring device 14 has a switching unit 26 that is connected to the post processing unit 22 such that a certain mode of the measuring device 14 can be selected by the switching unit 26. The mode selected relates to a setting of the signal correction filter 24.

In the shown embodiment, the measuring device 14 comprises a detection unit 28 that is used to detect an event in the probe signal. The detection unit 28 may be connected to the probe interface 18 such that the detection unit 28 receives the analog probe signal before it is digitized by the acquisition unit 20. Alternatively, the detection unit 28 receives the already digitized probe signal.

The detection unit 28 is connected to the switching unit 26 such that the switching unit 26 is controlled by the detection unit 28 based on an event detected in the probe signal. Thus, the mode of the measuring device 14 is changed when the detection unit 28 detects an event.

In an alternative embodiment, the detection unit 28 (dashed lines) may be provided in the probe 16 itself such that the analog dynamic data signal is scanned by the detection unit 28.

Furthermore, a trigger unit 30 may be provided that is configured to derive an event from the probe signal corresponding to the data signal. This trigger unit 30 differs from a record trigger unit (not shown) that is configured to trigger the beginning of the probing.

According to the shown embodiment, the detection unit 28 and the trigger unit 30 are formed integrally such that the detection unit 28 has a triggering function. Therefore, the detection unit 28 detects an event in the probe signal and triggers the post processing unit 22 appropriately based on the event. In some embodiments, the trigger unit 30 controls the switching unit 26 such that a certain mode is selected based on the event detected wherein the mode selected relates to a certain setting of the signal correction filter 24. Further, the time variable coefficients of the signal correction filter 24 are adapted appropriately based on the event detected such that the characteristics of the signal correction filter 24 are adapted dynamically.

Alternatively to the shown embodiment, the detection unit 28 and the trigger unit 30 may be formed separately.

Figure 2:
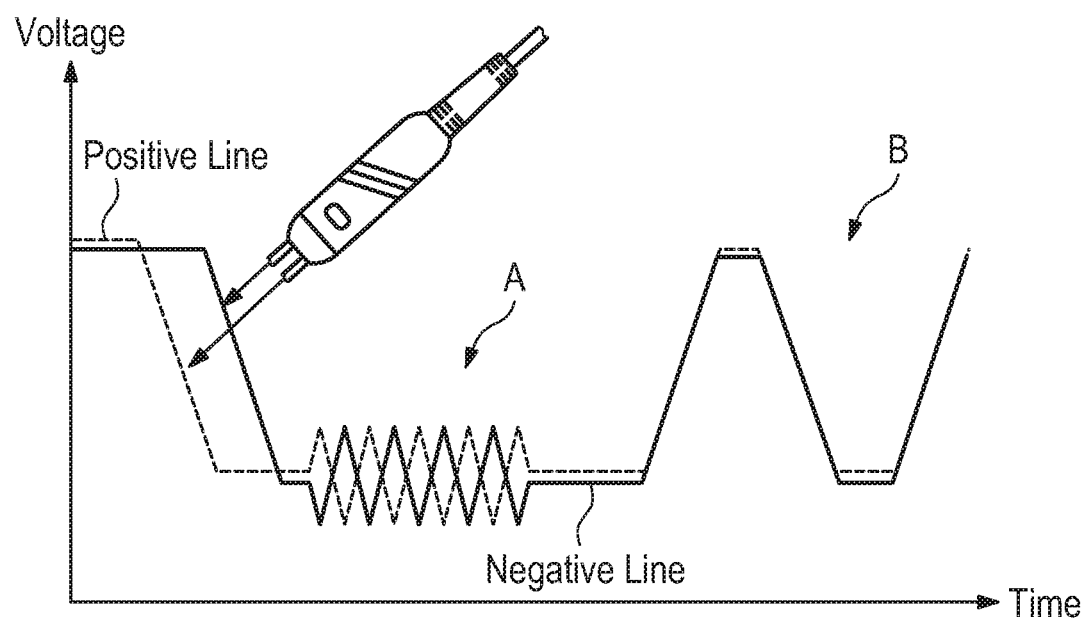
FIG. 2 schematically shows a diagram of a probe signal gathered by a dynamic measuring system according to an embodiment of the disclosure.

As already mentioned, the detection unit 28 detects a certain event in the probe signal that may relate to dynamically changing characteristics of the dynamic data signal. These dynamically changing characteristics of the dynamic data signal may correspond to a different operation mode of the device under test 12, for instance a changing source impedance of the device under test 12 due to a changing from a high speed operation mode A to a low power operation mode B or vice versa as shown in FIG. 2.

Upon the detection of the event in the probe signal, the trigger unit 30 triggers such that the switching unit 26 selects a certain mode, in particular the first mode or the second mode. Then, the setting of the signal correction filter 24 are adapted appropriately, for example the first signal correction filter setting or the second one is selected.

Accordingly, the setting of the signal correction filter 24 is dynamically adapted based on the dynamically changing characteristics of the dynamic data signal probed. Hence, the different modes of the measuring device 14 relate to certain settings of the signal correction filter 24 of the post processing unit 22. Thus, the signal correction filter 24 has at least two different signal correction filter settings relating to at least two different modes of the measuring device 14.

In addition, the time variable coefficients of the signal correction filter 24 are adapted in an appropriate manner. The time variable coefficients can be set dynamically during the probing such that the characteristics of the post processing unit 22 are adapted live. Alternatively or supplementary, the characteristics are adapted during the post processing.

Generally, it is ensured that the device under test 12 has to be contacted only once even though the data signal obtained changes dynamically during the probing.

As already mentioned, at least two different modes are provided which may relate to a high voltage mode and a low voltage mode and/or a single ended mode and a differential mode.

For instance, the first signal correction filter setting of the signal correction filter 24 relates to the high voltage mode of the measuring device whereas the second signal correction filter setting relates to the low voltage mode.

The setting of the signal correction filter 24 can be adapted dynamically such that it is adapted to the dynamically changing characteristics of the data signal probed by the probe 16.

Furthermore, the post processing unit 22 may have two signal correction filters 24 that are each provided for a certain mode. Thus, the first signal correction filter 24 is used in the first mode whereas the second signal correction filter 24 is used in the second mode. Both signal correction filters 24 have time variable coefficients that are adapted over time with regard to the dynamically changing characteristics of the data signal probed.

Accordingly, the switching unit 26 selects the first signal correction filter 24 or the second one for processing the signal depending on a certain event detected in the data signal, the probe signal or the digitized signal. In the respective mode, the characteristics of the corresponding signal correction filter 24, in particular its time variable coefficients, are adapted appropriately.

The total measurement time and the risk of errors are reduced while the quality of the measurement is increased simultaneously.

It should be noted that for purposes of this disclosure, terminology such as "upper," "lower," "vertical," "horizontal," "inwardly," "outwardly," "inner," "outer," "front," "rear," etc., should be construed as descriptive and not limiting the scope of the claimed subject matter. Further, the use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. The term "about," "approximately," "substantially," "near" etc., means plus or minus 10% of the stated value or condition.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A dynamic measuring system for probing a dynamic data signal of a device under test, the dynamic measuring system comprising:
   a measuring device with a probe interface that is configured to receive a probe signal from a probe that probes the dynamic data signal of the device under test, said probe signal corresponding to said dynamic data signal,
   an acquisition unit that is configured to acquire and digitize said probe signal into a digital signal, and
   a post processing unit that is configured to post process said digital signal, said post processing unit having at least one signal correction filter that is configured to be operated in at least two different modes for processing said digital signal, said signal correction filter having at least a first signal correction filter setting that is used in a first mode and a second signal correction filter setting that is used in a second mode,
   wherein a detection unit is provided that is configured to detect an event in said probe signal corresponding to said dynamic data signal,
   wherein a switching unit is provided that is configured to select said first mode associated with said first signal correction filter setting or said second mode associated with said second signal correction filter setting, and wherein said switching unit is configured to be operated dynamically based on said event,
   wherein said detection unit is configured to control said switching unit such that said switching unit selects said appropriate mode based on the detection of said event,
   said signal correction filter comprising time variable coefficients.

2. The dynamic measuring system according to claim 1, wherein said signal correction filter is configured to adapt its characteristics over time.

3. The dynamic measuring system according to claim 1, wherein a trigger unit is provided that is configured to derive at least one event from said dynamic data signal in order to control said post processing unit.

4. The dynamic measuring system according to claim 3, wherein said trigger unit is configured to automatically set said at least one signal correction filter.

5. The dynamic measuring system according to claim 3, wherein said trigger unit is configured to automatically set time variable coefficients of said at least one signal correction filter.

6. The dynamic measuring system according to claim 1, wherein said dynamic measurement system comprises said probe.

7. The dynamic measuring system according to claim 1, wherein said detection unit is integrated in said probe.

8. The dynamic measuring system according to claim 1, wherein said measuring device is an oscilloscope.

9. The dynamic measuring system according to claim 1, wherein said measuring device is an oscilloscope and said detection unit is integrated in said oscilloscope.

10. The dynamic measuring system according to claim 1, wherein said first mode is a high voltage mode or said second mode is a low voltage mode.

11. The dynamic measuring system according to claim 1, wherein said first mode is a single ended mode or said second mode is a differential mode.

12. The dynamic measuring system according to claim 1, wherein said dynamic measuring system is configured to use said single probe such that a single measurement channel of said measurement device is occupied during probing said dynamic data signal.

13. A method for probing a dynamic data signal comprising:
   providing a probe for probing a dynamic data signal of a device under test;
   providing a measuring device having a probe interface for receiving a probe signal corresponding to said dynamic data signal;
   processing said probe signal received by said probe in a post processing unit of said measuring device;
   detecting an event in said probe signal corresponding to said dynamic data signal by a detection unit;
   selecting via a switching unit of said measuring device a first mode or a second mode based on said event such that a signal correction filter is set in a first signal filter setting or in a second signal filter setting for processing said probe signal,
   wherein said detection unit controls said switching unit such that said switching unit selects said appropriate mode based on the detection of said event, and
   wherein said signal correction filter comprises time variable coefficients that are adapted over time.

14. The method according to claim 13, wherein said time variable coefficients are adapted automatically by using a trigger unit that derives at least one event from said dynamic data signal and, further, controls said post processing unit.

15. The method according to claim 13, wherein said probe contacts a device under test providing said dynamic data signal only once.

16. The method according to claim 13, wherein a dynamic measuring system for probing said dynamic data signal is provided, said dynamic measuring system comprising:
   said measuring device with said probe interface that is configured to receive said probe signal from said probe, said probe signal corresponding to said dynamic data signal,
   an acquisition unit that is configured to acquire and digitize said probe signal into a digital signal, and
   said post processing unit that is configured to post process said digital signal, said post processing unit having at least one said signal correction filter that is configured to be operated in at least two different modes for processing said digital signal, said signal correction filter having at least said first signal correction filter setting that is used in said first mode and said second signal correction filter setting that is used in said second mode,
   wherein said switching unit is provided that is configured to select said first mode or said second mode, said switching unit is configured to be operated dynamically based on said event in said dynamic data signal,
   said signal correction filter comprising time variable coefficients.

* * * * *